United States Patent [19]

Minato et al.

[11] Patent Number: 5,364,488
[45] Date of Patent: Nov. 15, 1994

[54] COAXIAL PLASMA PROCESSING APPARATUS

[75] Inventors: Mitsuaki Minato; Akira Uehara; Atsushi Matsushita, all of Kanagawa, Japan

[73] Assignee: Tokyo Ohka Kogyo Co., Ltd., Kanagawa, Japan

[21] Appl. No.: 954,210

[22] Filed: Sep. 30, 1992

[30] Foreign Application Priority Data

Sep. 30, 1991 [JP] Japan .................. 3-278837

[51] Int. Cl.$^5$ ............................ H01L 21/00
[52] U.S. Cl. .................. 156/345; 118/723 ER; 118/724; 118/725
[58] Field of Search ........... 118/723, 715, 719, 723 E, 118/723 ER; 156/345; 315/111.21; 204/298.33, 298.38

[56] References Cited

U.S. PATENT DOCUMENTS

| | | | |
|---|---|---|---|
| 4,782,785 | 11/1988 | Gohla et al. | 118/412 X |
| 4,838,983 | 6/1989 | Schumaker et al. | 118/730 X |
| 5,015,330 | 5/1991 | Okumura et al. | 156/643 |
| 5,052,472 | 10/1991 | Takahashi et al. | 165/1 |
| 5,097,890 | 3/1992 | Nakao | 118/724 X |
| 5,099,100 | 3/1992 | Bersin et al. | 156/345 X |
| 5,169,478 | 12/1992 | Miyamoto et al. | 118/725 X |

FOREIGN PATENT DOCUMENTS

| | | | |
|---|---|---|---|
| 60-8622 | 3/1985 | Japan . | |
| 64-55821 | 3/1989 | Japan | 118/724 |
| 1-161835 | 6/1989 | Japan . | |
| 2-54929 | 2/1990 | Japan . | |
| 4-17330 | 1/1992 | Japan . | |

OTHER PUBLICATIONS

Perry and Chilton, *Chemical Engineers' Handbook*, 5th Edition, 1973, pp. 22-72 to 22-73.

*Primary Examiner*—R. Bruce Breneman
*Assistant Examiner*—Jonathan D. Baskin
*Attorney, Agent, or Firm*—Irving M. Weiner; Joseph P. Carrier; Pamela S. Burt

[57] ABSTRACT

A plasma processing apparatus for ashing semi-conductors wafers has a vertically elongate cylindrical chamber for generating a plasma for processing a workpiece housed therein with heat applied thereto. The cylindrical chamber has upper and lower open ends closed respectively by upper and lower chamber plates. A cooling coil is positioned above the upper chamber plate. A temperature controller actuates a fan unit to force an air flow over the cooling coil to the upper chamber plate for keeping the temperature in the cylindrical chamber within a predetermined range. The plasma processing apparatus includes inner and outer electrodes disposed inside and outside, respectively, of the cylindrical chamber, and a Radio Frequency generator for generating the plasma between the inner and outer electrodes.

16 Claims, 3 Drawing Sheets

PRIOR ART

COAXIAL PLASMA PROCESSING APPARATUS

BACKGROUND OF THE INVENTION

1. Field of the Invention

The present invention relates to a coaxial plasma processing apparatus for ashing a resist film on a semiconductor wafer, for example.

2. Description of the Prior Art

Japanese patent publication No. 53-33471 discloses a coaxial plasma processing apparatus in which inner and outer cylindrical electrodes are coaxially arranged with a cylindrical chamber interposed therebetween.

As shown in FIG. 1 of the accompanying drawings, the disclosed coaxial plasma processing apparatus comprises a vertically elongate cylindrical chamber 100 of quartz or the like which has upper and lower openings closed by respective chamber plates 101, 102. Inner and outer cylindrical electrodes 103, 104 are coaxially positioned inside and outside, respectively, of the cylindrical chamber 100. The coaxial plasma processing apparatus also has a preheater 105 located outwardly of the outer cylindrical electrode 104.

A wafer holder 106 comprising vertical rods of quartz or the like carries a vertical stack of 50 to 100 wafers 107. In operation, the wafer holder 106 with the stack of wafers 107 held thereby is inserted upwardly into the coaxial plasma processing apparatus through the lower chamber plate 102 in the direction indicated by the arrow A.

Then, the cylindrical chamber 100 is evacuated, and oxygen is introduced into the evacuated cylindrical chamber 100. The preheater 105 is energized to heat the coaxial plasma processing apparatus for thereby providing conditions for generating a plasma in the coaxial plasma processing apparatus. A Radio Frequency generator 108 connected to the outer cylindrical electrode 104 is thereafter energized to generate an oxygen plasma between the outer and inner cylindrical electrodes 104, 103.

The generated oxygen plasma ashes a photoresist on the surfaces of the wafers 107 supported on the wafer holder 106.

FIG. 2 of the accompanying drawings shows the temperature dependency of the ashing rate of each of the wafers 107. The horizontal axis of the graph of FIG. 2 represents radial positions, i.e., an end, a center, and an opposite end of the wafer 107, and the vertical axis the ashing rate. Parameters t0, t1, t2 indicate different processing temperatures, and are of the relationship of $t0 < t1 < t2$.

Study of FIG. 2 reveals that the ashing rate is lower at the center of the wafer 107 than at the ends of the wafer 107, and the ashing rate is higher as the processing temperature is higher.

The preheater 105 serves to keep the apparatus at a certain temperature for thereby increasing the ashing rate to a certain level.

When an oxygen plasma is generated in the coaxial plasma processing apparatus, the temperature in the cylindrical chamber 100 tends to rise gradually due to the heat of the plasma. Since the cylindrical chamber 100 is vertically elongate for housing the stack of 50 to 100 wafers 107, the upper portion of the cylindrical chamber 100 becomes hotter than the lower portion thereof because of a draft generated in the cylindrical chamber 100. Therefore, as shown in FIG. 2, those wafers 107 which are positioned higher in the cylindrical chamber 100, and are thus exposed to higher temperatures, suffer greater ashing rate differences between the ends and center of the wafers 107.

SUMMARY OF THE INVENTION

It is therefore an object of the present invention to provide a coaxial plasma processing apparatus which can achieve uniform ashing rates of wafers at different positions thereon.

According to the present invention, there is provided a plasma processing apparatus comprising a chamber for generating a plasma for processing a workpiece housed therein with heat applied thereto, a cooling coil positioned adjacent to the chamber, a fan unit for forcing an air flow over the cooling coil to the chamber, and control means for controlling the fan unit to keep the temperature in the chamber within a predetermined range.

The chamber is of a vertically elongate cylindrical shape and has upper and lower open ends. The plasma process apparatus further includes upper and lower chamber plates closing the upper and lower open ends, respectively, inner and outer electrodes disposed inside and outside, respectively, of the chamber, and generator means for generating the plasma between the inner and outer electrodes. The cooling coil is positioned above the upper chamber plate, and the upper chamber plate has a plurality of heat radiating fins.

The control means comprises a thermocouple attached to the upper chamber plate for detecting the temperature of the upper chamber plate, and a temperature controller for controlling the fan unit based on the temperature detected by the thermocouple.

The plasma processing apparatus also includes heating means for heating the chamber in generating the plasma in the chamber. The heating means comprises an upper heater disposed around an upper portion of the chamber, a lower heater disposed around a lower portion of the chamber, and a pair of upper and lower heater control means for controlling the upper and lower heaters, respectively, to achieve uniform temperature distribution in the chamber. The upper heater control means comprises an upper thermocouple disposed in the upper portion of the chamber for detecting the temperature therein, and an upper heater controller for selectively turning on or off the upper heater based on the temperature detected by the upper thermocouple. The lower heater control means comprises a lower thermocouple disposed in the lower portion of the chamber for detecting the temperature therein, and a lower heater controller for controlling the lower heater in a proportional plus integral plus derivative control mode based on the temperature detected by the lower thermocouple.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
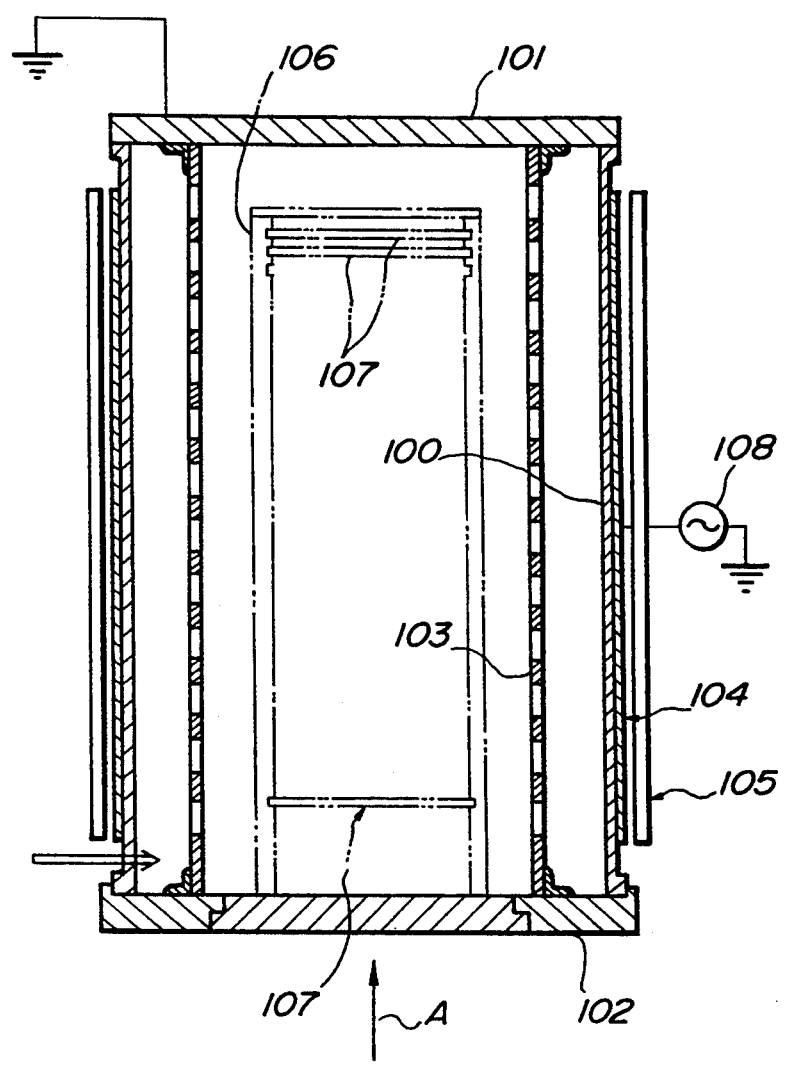
FIG. 1 is a vertical cross-sectional view of a conventional coaxial plasma processing apparatus.
Figure 2:
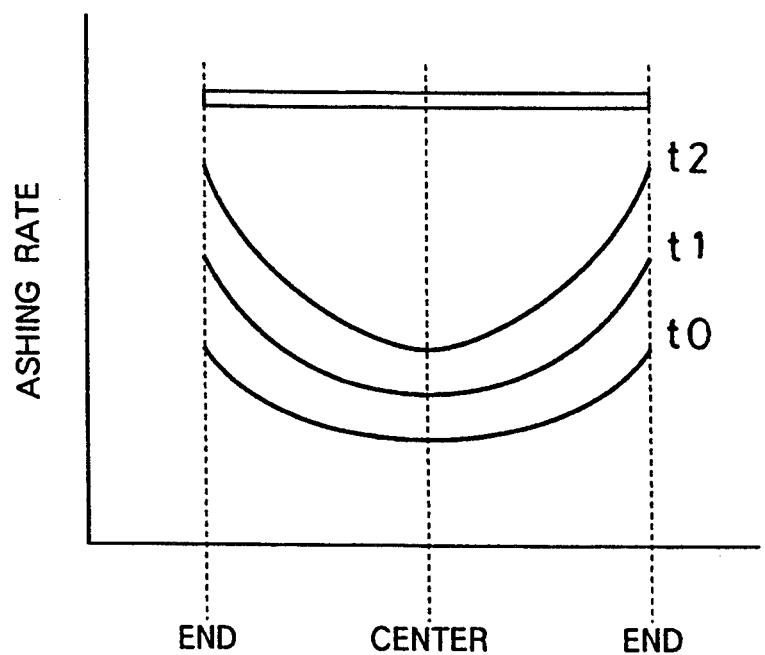
FIG. 2 is a graph showing temperature-dependent ashing rates of wafers which are ashed by the conventional coaxial plasma processing apparatus.
Figure 3:
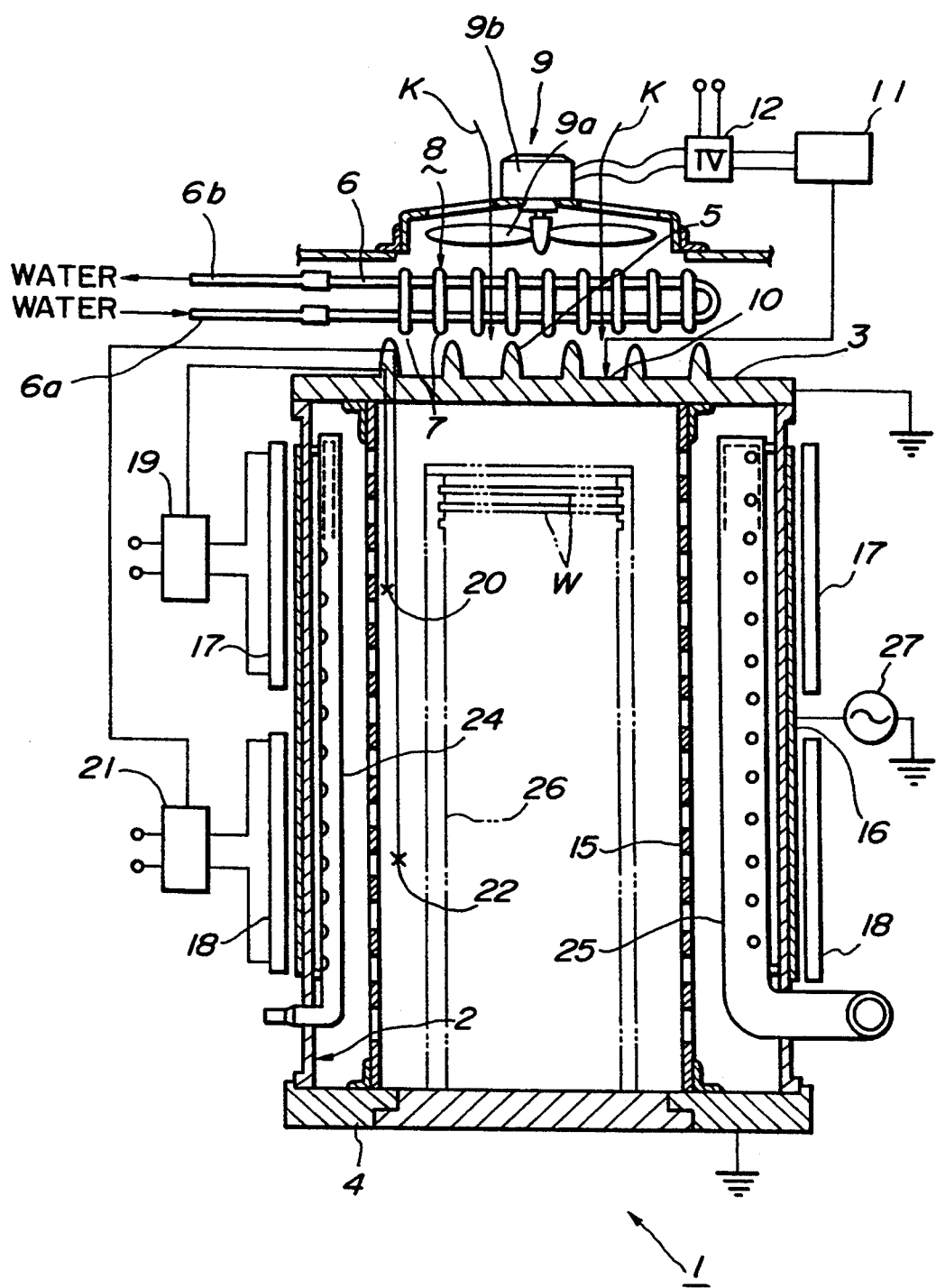
FIG. 3 is a vertical cross-sectional view of a coaxial plasma processing apparatus according to the present invention.

As shown in FIG. 3, a coaxial plasma processing apparatus 1 according to the present invention has a vertically elongate cylindrical chamber 2 of quartz or the like which has upper and lower openings closed by respective upper and lower chamber plates 3, 4. The upper chamber plate 3 has a plurality of heat radiating fins 5 integral with the upper surface thereof and projecting upwardly therefrom. The coaxial plasma processing apparatus also includes a cooling coil 8 positioned slightly above the heat radiating fins 5. The cooling coil 8 comprises a horizontal water pipe 6 of copper and a plurality of cooling fins 7 attached to the water pipe 6 at spaced intervals. The water pipe 6 is of a substantially U shape and has two open ends, one serving as a water inlet 6a and the other a water outlet 6b.

A fan unit 9 is positioned upwardly of the cooling coil 8. The fan unit 9 comprises a fan blade 9a and a motor 9b for rotating the fan blade 9a. The fan unit 9 is controlled by a closed loop composed of a thermocouple 10 attached to the upper chamber plate 3, a temperature controller 11 for detecting the temperature of the upper chamber plate 3 through the thermocouple 10, and a variable-speed inverter 12 for controlling the rotational speed of the motor 9b based on a control signal from the temperature controller 11.

Inner and outer cylindrical electrodes 15, 16 are coaxially positioned inside and outside, respectively, of the cylindrical chamber 2. The inner electrode 15 is grounded through the upper chamber plate 3. The coaxial plasma processing apparatus 1 also has a pair of vertically aligned upper and lower heaters 17, 18 disposed around the outer cylindrical electrode 16, i.e., around upper and lower portions, respectively, of the cylindrical chamber 2. Each of the upper and lower heaters 17, 18 comprises an infrared heater. The upper heater 17 is selectively energizable by an upper heater controller 19. Specifically, the upper heater controller 19 selectively turns on or off the upper heater 17 based on a temperature detected by an upper thermocouple 20 that is located in the upper portion of the cylindrical chamber 2. The lower heater 18 is selectively energizable by a lower heater controller 21. Specifically, the lower heater controller 21 controls the lower heater 18 in a proportional plus integral plus derivative (PID) control mode based on a temperature detected by a lower thermocouple 22 that is located in the lower portion of the cylindrical chamber 2.

The proportional plus integral plus derivative control mode increases the heater output energy when the detected temperature is largely different from a preset temperature, and reduces the heater output energy when the detected temperature is close to the preset temperature, for thereby preventing overshoot or hunting.

The coaxial plasma processing apparatus 1 further includes a gas inlet pipe 24 extending into the cylindrical chamber 2, and a gas outlet pipe 25 extending out of the cylindrical chamber 2.

A wafer holder 26 comprising vertical rods of quartz or the like carries a vertical stack of 50 to 100 wafers W. A Radio Frequency generator 27 is connected to the outer cylindrical electrode 16.

Operation of the coaxial plasma processing apparatus 1 will be described below.

The cylindrical chamber 2 is evacuated through the air outlet pipe 25 to a vacuum of about $10^{-5}$ Torr. Thereafter, oxygen or a mixture of oxygen and helium is introduced through the gas inlet pipe 24 into the cylindrical chamber 2 to keep a pressure ranging from 0.5 to 1.0 Torr in the cylindrical chamber 2.

The upper and lower heaters 17, 18 are energized to maintain the interior of the cylindrical chamber 2 at a temperature of 80° C. The Radio Frequency generator 27 is thereafter energized to generate a plasma between the outer and inner cylindrical electrodes 16, 15, which thereby begins to ash the wafers W.

The time in which to completely ash the resist films on the wafers W may vary depending on the film thickness of a photoresist on each of the wafers W and the number of wafers W to be ashed, but is typically about 20 seconds. While the wafers W are being ashed in this period of time, the temperature in the cylindrical chamber 2 tends to gradually increase. Therefore, at some point of time in the ashing process, the upper heater 17 is turned off by the upper heater controller 19. The lower heater 18 is controlled by the lower heater controller 19 so that the thermal output energy of the lower heater 18 is gradually lowered. As a result, the temperature in the cylindrical chamber 2 is prevented from unduly increasing.

While the coaxial plasma processing apparatus 1 is in operation, the thermocouple 10 is monitoring the temperature of the upper chamber plate 3 at all times. When the temperature detected by the thermocouple 10 exceeds a preset temperature of 90° C., for example, in the temperature controller 11, the temperature controller 11 enables the variable-speed inverter 12 to energize the motor 9b to rotate the fan 9a for thereby forcing an air flow K to pass over the cooling coil 8 toward the upper chamber plate 3.

Cooling water whose temperature ranges from 10° to 20° C. is continuously flowing through the water pipe 6 from the water inlet 6a to the water outlet 6b. The air flow K passing over the cooling coil 8 is therefore cooled by the cooling fins 7, and then applied to the upper chamber plate 3. The upper chamber plate 3 can be sufficiently cooled by the applied air flow K because the heat radiating fins 5 on the upper chamber plate 3 provide a large surface area for heat dissipation.

If the temperature of the upper chamber plate 3 continues to rise even after the fan unit 9 has started to operate, the temperature controller 11 controls the inverter 12 to increase the rotational speed of the fan unit 9 for supplying the air flow K at an increased rate to the upper chamber plate 3.

When the temperature of the upper chamber plate 3 drops down to the preset temperature of 90° C., the temperature controller 11 controls the inverter 12 to reduce the rotational speed of the fan unit 9. The temperature controller 11 controls the inverter 12 to turn off the fan unit 9 when the temperature of the upper chamber plate 3 reaches a second, lower present temperature of 85° C. for example.

Once the response of the temperature controller 11 is selected to match the temperature characteristics of the cylindrical chamber 2, it is easily possible to operate the fan unit 9 for keeping the temperature of the upper chamber plate 3 within a predetermined temperature range between the two preset temperature, i.e., of from 85° C. to 90° C.

The upper chamber plate 3 is relatively simple in structure as it is separate from the cooling coil 8 that is used to cool the upper chamber plate 3.

In the illustrated embodiment, when the temperature in the cylindrical chamber 2 increases, the upper heater 17 is de-energized, and the lower heater 18 is controlled for a reduction in the thermal output energy produced thereby. In this manner, the vertical temperature distribution in the vertically elongate cylindrical chamber 2 can be made substantially even.

The forced cooling of the upper chamber plate 3 and the separate control of the upper and lower heaters 17, 18 cooperate with each other in keeping the temperature in the cylindrical chamber 2 within a predetermined range. Consequently, any difference between the ashing rates of each wafer W at opposite ends thereof is minimized, resulting in relatively uniform ashing rates of the wafers W.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A plasma processing apparatus comprising:
   a chamber for generating a plasma for processing a workpiece housed therein with heat applied thereto;
   cooling means for cooling only an upper end of said chamber, means including a cooling coil positioned adjacent to an upper end of said chamber;
   a fan unit for forcing an air flow over said cooling coil to the upper end of said chamber; and
   control means for controlling said fan unit to keep the temperature in said chamber within a predetermined range while the workpiece is being heated.

2. A plasma processing apparatus according to claim 1, wherein said chamber is of a vertically elongate cylindrical shape and has upper and lower open ends, further including:
   upper and lower chamber plates closing said upper and lower open ends, respectively;
   inner and outer electrodes disposed inside and outside, respectively, of said chamber; and
   generator means for generating said plasma between said inner and outer electrodes.

3. A plasma processing apparatus according to claim 2, wherein said cooling coil is positioned above said upper chamber plate, and said upper chamber plate has a plurality of heat radiating fins.

4. A plasma processing apparatus according to claim 2, wherein said control means comprises a thermocouple attached to said upper chamber plate for detecting the temperature of the upper chamber plate, and a temperature controller for controlling said fan unit based on the temperature detected by said thermocouple.

5. A plasma processing apparatus according to claim 1, further including heating means for heating said chamber in generating the plasma in the chamber, and heater control means for controlling said heating means to achieve a uniform temperature distribution in said chamber; and said fan control means and said heater control means are adapted to simultaneously activate said fan unit and said heating means during a plasma processing operation.

6. A plasma processing apparatus according to claim 1, further including heating means for heating said chamber in generating the plasma in the chamber,
   said chamber is of a vertically elongate cylindrical shape, and said heating means comprising:
   an upper heater disposed around an upper portion of said chamber;
   a lower heater disposed around a lower portion of said chamber; and
   a pair of upper and lower heater control means for controlling said upper and lower heaters, respectively, to achieve a uniform temperature distribution in said chamber; and said fan control means and said lower heater control means are adapted to simultaneously activate said fan unit and said lower heater during a plasma processing operation.

7. A plasma processing apparatus according to claim 1, wherein said fan unit forces said air flow in a direction parallel to a longitudinal axis of said chamber.

8. A plasma processing apparatus comprising:
   a chamber for generating a plasma for processing a workpiece housed therein with heat applied thereto;
   a cooling coil positioned adjacent to said chamber;
   a fan unit for forcing an air flow over said cooling coil to said chamber:
   control means for controlling said fan unit to keep the temperature in said chamber within a predetermined range; and
   heating means for heating said chamber in generating the plasma in the chamber, said chamber is of a vertically elongate cylindrical shape, and said heating means comprising:
   an upper heater disposed around an upper portion of said chamber:
   a lower heater disposed around a lower portion of said chamber; and
   a pair of upper and lower heater control means for controlling said upper and lower heaters, respectively, to achieve a uniform temperature distribution in said chamber;
   said upper heater control means comprises an upper thermocouple disposed in the upper portion of said chamber for detecting the temperature therein, and an upper heater controller for selectively turning on or off said heater based on the temperature detected by said upper thermocouple, and wherein said lower heater control means comprises a lower thermocouple disposed in the lower portion of said chamber for detecting the temperature therein, and a lower heater controller for controlling the lower heater in a proportional plus integral plus derivative control mode based on the temperature detected by said lower thermocouple.

9. A coaxial plasma processing apparatus comprising:
   a vertically elongate cylindrical chamber for generating a plasma for processing a workpiece housed therein with heat applied thereto, said vertically cylindrical chamber having upper and lower open ends;
   upper and lower chamber plates closing said upper and lower open ends, respectively;

inner and outer electrodes disposed coaxially inside and outside, respectively, of said vertically elongate cylindrical chamber;

a cooling coil positioned adjacent to said upper plate; and a fan unit for forcing an air flow over said cooling coil to said upper chamber plate to thereby cool said upper chamber plate and achieve a substantially uniform temperature distribution vertically throughout said chamber during a plasma processing operation.

10. A coaxial plasma processing apparatus according to claim 9, wherein said upper chamber plate has a plurality of heat radiating fins.

11. A coaxial plasma processing apparatus according to claim 9, further including heating means disposed around said vertically elongate cylindrical chamber for heating the chamber in generating the plasma in the chamber.

12. A plasma processing apparatus according to claim 11, wherein said heating means comprises:

an upper heater disposed around an upper portion of said chamber;

a lower heater disposed around a lower portion of said chamber.

13. A plasma processing apparatus according to claim 12, further including heater control means for deenergizing said upper heater and controlling said lower heater to reduce thermal output energy generated thereby at a given point in time while the workpiece is being processed in said vertically elongate cylindrical chamber.

14. A plasma processing apparatus according to claim 12, wherein each of said upper and lower heaters comprises an infrared heater.

15. A plasma processing apparatus according to claim 12, further including control means for controlling said fan unit and said heating means, and said control means is adapted to operate said fan unit simultaneously with said lower heater for achieving said substantially uniform temperature distribution.

16. A coaxial plasma processing apparatus according to claim 9, wherein said fan unit forces air over said cooling coil to said upper plate in a direction parallel to a longitudinal axis of said cylindrical chamber.

* * * * *

UNITED STATES PATENT AND TRADEMARK OFFICE
CERTIFICATE OF CORRECTION

PATENT NO. : 5,364,488
DATED : November 15, 1994
INVENTOR(S) : Minato et al.

It is certified that error appears in the above-indentified patent and that said Letters Patent is hereby corrected as shown below:

In the Abstract, line 2, change "tors" to --tor--.

Column 4, line 67, change "temperature," to --temperatures,--.

Column 5, line 35 (claim 1, line 6), after "chamber," insert --said cooling--.

Signed and Sealed this

Seventeenth Day of January, 1995

Attest:

BRUCE LEHMAN

Attesting Officer

Commissioner of Patents and Trademarks